(12) United States Patent
Mudama et al.

(10) Patent No.: US 8,621,141 B2
(45) Date of Patent: Dec. 31, 2013

(54) METHOD AND SYSTEM FOR WEAR LEVELING IN A SOLID STATE DRIVE

(75) Inventors: Eric D. Mudama, Longmont, CO (US); David M. Jones, Boulder, CO (US); Andrew W. Vogan, Aloha, OR (US)

(73) Assignee: Intel Corporations, Santa Clara, CA (US)

( * ) Notice: Subject to any disclaimer, the term of this patent is extended or adjusted under 35 U.S.C. 154(b) by 714 days.

(21) Appl. No.: 12/752,659

(22) Filed: Apr. 1, 2010

(65) Prior Publication Data

US 2011/0246705 A1    Oct. 6, 2011

(51) Int. Cl.
*G06F 12/00* (2006.01)

(52) U.S. Cl.
USPC ........... 711/103; 711/159; 711/202; 711/206; 711/E12.059; 711/E12.008

(58) Field of Classification Search
USPC .................. 711/103, 159, 202, 206, E12.001, 711/E12.008, E12.059
See application file for complete search history.

(56) References Cited

U.S. PATENT DOCUMENTS

| | | | |
|---|---|---|---|
| 5,737,742 A | 4/1998 | Achiwa et al. | |
| 8,266,367 B2 * | 9/2012 | Yu et al. | 711/103 |
| 2007/0283428 A1 * | 12/2007 | Ma et al. | 726/9 |
| 2008/0082736 A1 * | 4/2008 | Chow et al. | 711/103 |
| 2008/0320213 A1 | 12/2008 | Kinoshita | |
| 2009/0089485 A1 * | 4/2009 | Yeh | 711/103 |
| 2009/0327591 A1 * | 12/2009 | Moshayedi | 711/103 |
| 2010/0017555 A1 | 1/2010 | Chang et al. | |
| 2010/0037006 A1 | 2/2010 | Chen et al. | |
| 2010/0125696 A1 * | 5/2010 | Kumar et al. | 711/103 |
| 2010/0268865 A1 * | 10/2010 | Ramiya Mothilal | 711/103 |

FOREIGN PATENT DOCUMENTS

| | | |
|---|---|---|
| EP | 1840722 | 3/2009 |
| KR | 1020050065632 | 6/2005 |
| WO | 2004040458 | 5/2004 |
| WO | WO-2004040578 | 5/2004 |
| WO | 2009108619 | 9/2009 |

OTHER PUBLICATIONS

Combined Search and Examination Report for Great Britain Patent Application No. GB1104299.1, Mailed Jul. 6, 2011, 8 pages.
Office Action 1 for KR Application No. 10-2011-28957, dated Aug. 20, 2012, 7 pp. (With English Translation) [77.251KR (OA1)].

(Continued)

*Primary Examiner* — Pierre-Michel Bataille
(74) *Attorney, Agent, or Firm* — Konrad Raynes Davda & Victor LLP; David W. Victor

(57) ABSTRACT

A method and system for wear leveling in a solid state drive by mapping the logical regions of the solid state drive that hold static content or information into the physical regions of the solid state drive that have erase counts more than an average erase count of all of the physical regions. By doing so, it allows the solid state drive to wear level itself naturally through continued usage. In one embodiment of the invention, the erase count of each physical region is incremented with every erasing operation of each physical region. The physical regions that have a high count of erase count operations are mapped with content of the logical regions with static content so that the possibility of future erase operations of these physical regions is reduced.

23 Claims, 4 Drawing Sheets

(56) References Cited

OTHER PUBLICATIONS

Response to Office Action 1 for KR Application No. 10-2011-28957, dated Oct. 19, 2012, 24 pp. (With English Translation of Claims) [77.251KR (ROA1)].

Final Office Action 1 for KR Application No. 10-201-28957, dated Feb. 26, 2013, 4 pp. [77.251KR (FOA1)].

Office Action 2 for GB Application No. 1104299.1, dated Oct. 25, 2012, 3 pp. [77.251GB (OA2)].

Response to Office Action 2 for GB Application No. 1104299.1, dated Dec. 24, 2012, 17 pp. [77.251GB (ROA2)].

Office Action 3 for GB Application No. 1104299.1, dated Jun. 21, 2013, 4 pp. [77.251GB (0A3)].

Response to Office Action 3 for GB Application No. 1104299.1, dated Aug. 19, 2013, 16 pp. [77.251GB (ROA3)].

Office Action 4 for GB Application No. 1104299.1, dated Oct. 17, 2013, 3 pp. [77.251GB (0A4)].

* cited by examiner

METHOD AND SYSTEM FOR WEAR LEVELING IN A SOLID STATE DRIVE

FIELD OF THE INVENTION

This invention relates to a solid state drive, and more specifically but not exclusively, to a technique for wear leveling of the memory modules in a solid state drive.

BACKGROUND DESCRIPTION

Solid state drives (SSDs) often use multiple NAND flash memory blocks or modules to increase storage capacity. However, each NAND flash memory module has a limited number of write or erase cycles before it breaks down and this can affect the reliability of the SSD, especially in an environment where the host accesses of the SSD are unpredictable. Without any control of the write or erase operations to a particular SSD, some NAND flash memory modules may be written or erased more frequently than the other modules and therefore affect the reliability or life-time of the particular SSD.

BRIEF DESCRIPTION OF THE DRAWINGS

The features and advantages of embodiments of the invention will become apparent from the following detailed description of the subject matter in which.

DETAILED DESCRIPTION

Figure 1:
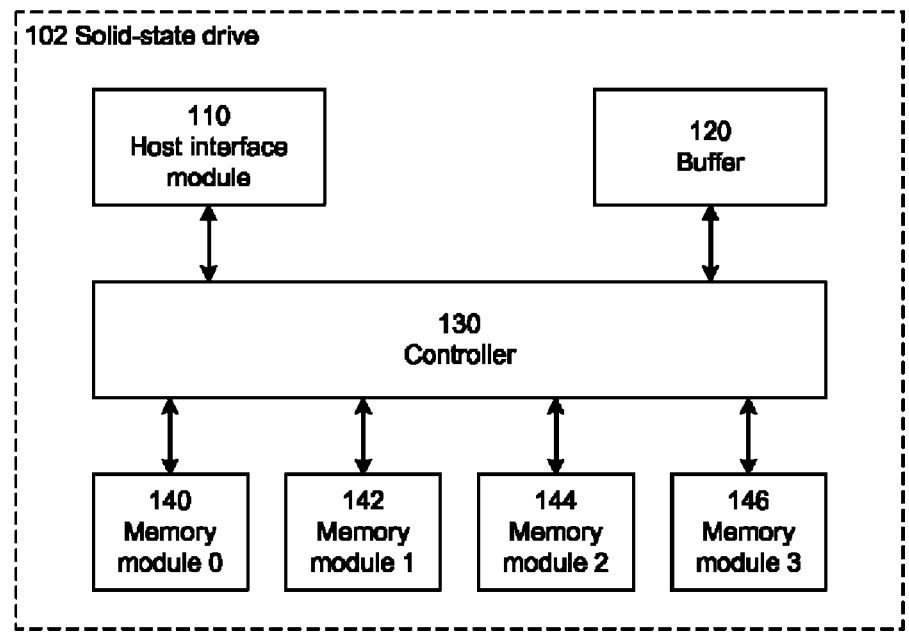
FIG. 1 illustrates a block diagram of a solid state drive in accordance with one embodiment of the invention.

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

Embodiments of the invention provide a method and system for wear leveling in a SSD by mapping the logical regions of the SSD that hold static content or information into the physical regions of the SSD that have erase counts more than an average erase count of all of the physical regions. By doing so, it allows the SSD to wear level itself naturally through continued usage. In one embodiment of the invention, the erase count of each physical region is incremented with every erasing operation of each physical region. The physical regions that have a high count of erase count operations are mapped with content of the logical regions with static content so that the possibility of future erase operations of these physical regions is reduced.

In one embodiment of the invention, the wear leveling in the SSD is performed when the difference between the average erase count of all the physical regions and the minimum erase count of all the physical regions has exceeded a threshold. The wear leveling in the SSD is also performed when the difference between the maximum erase count of all the physical regions and the average erase count of all the physical regions has exceeded a threshold. In one embodiment of the invention, the threshold for both scenarios is the same. In another embodiment of the invention, each scenario uses a different threshold. The use of the threshold allows the SSD to wear level with minimal negative performance impact when the thresholds are not exceeded.

FIG. 1 illustrates a block diagram 100 of a solid state drive 102 in accordance with one embodiment of the invention. The SSD 102 has a controller 130, a host interface module 110, a buffer 120, and memory module 0 140, memory module 1 142, memory module 2 144, and memory module 3 146. In one embodiment of the invention, the host interface module 110 provides an interface to connect with a host device or system. The host interface module 110 operates in accordance with a communication protocol, including but not limited to, Serial Advanced Technology Attachment (SATA) Revision 1.x, SATA Revision 2.x, SATA Revision 3.x, and any other type of communication protocol.

The buffer 120 provides temporary storage to the SSD 102 in one embodiment of the invention. The buffer includes Synchronous Dynamic Random Access Memory (SDRAM), Dynamic Random Access Memory (DRAM), RAMBUS Dynamic Random Access Memory (RDRAM), and/or any other type of random access memory device.

The controller 130 has logic to facilitate access to the memory modules 0-3 and enables wear leveling of the memory modules 0-3 140, 142, 144, and 146 in one embodiment of the invention. The controller 130 partitions or separates the memory modules 0-3 140, 142, 144, and 146 into logical bands and physical bands and performs wear leveling by relocating static content in the logical bands to the physical bands that have an erase count that exceeds an average erase count of all the physical bands.

In one embodiment of the invention, the memory modules 0-3 140, 142, 144, and 146 include, but are not limited to, NAND flash memories, and memories that have a limited number of write or erase cycles. The number of memory modules shown in FIG. 1 is not meant to be limiting and in other embodiments of the invention, there can be more or less than four memory modules.

Figure 2:
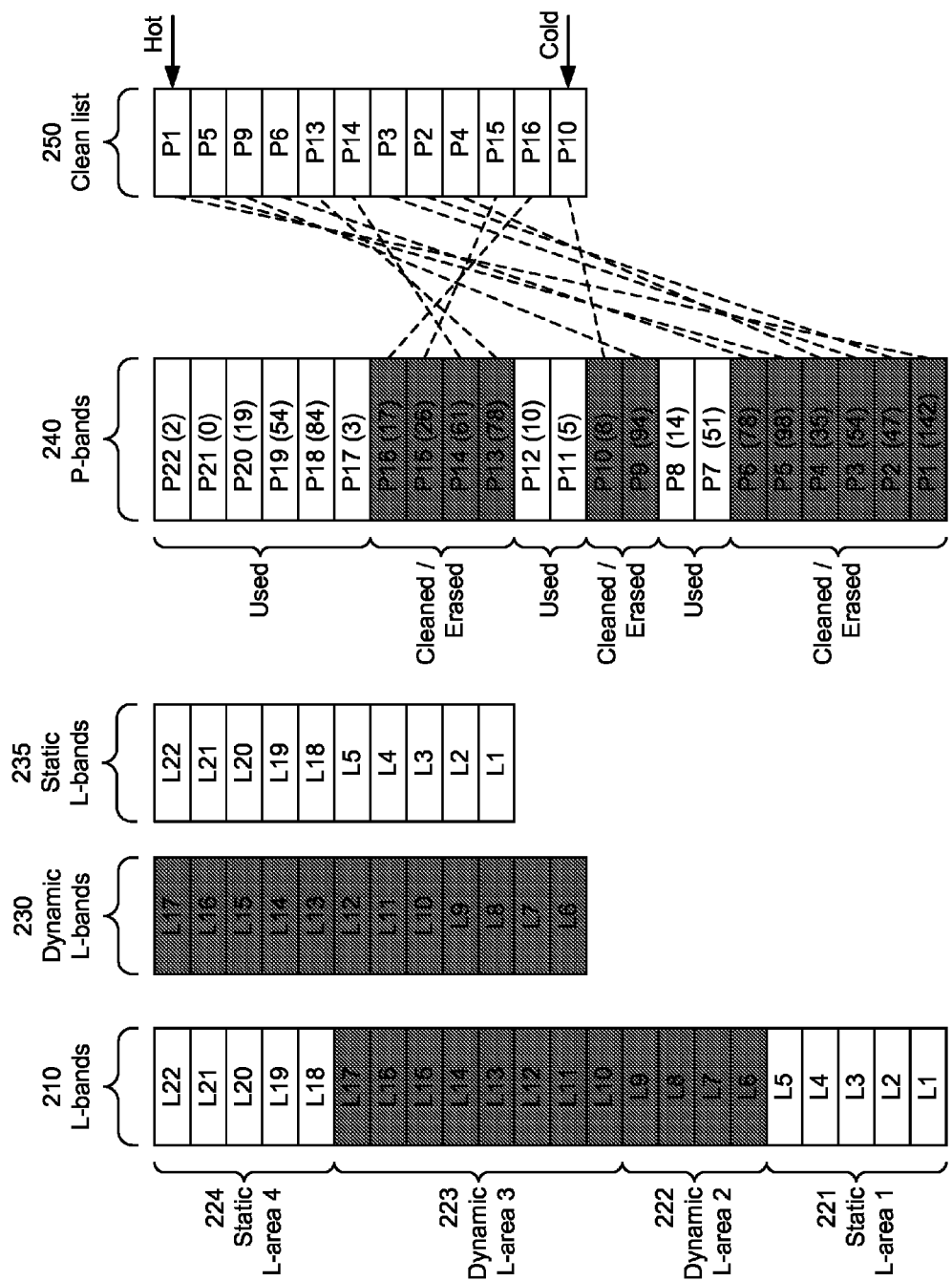
FIG. 2 illustrates an arrangement of a solid state drive in accordance with one embodiment of the invention.

FIG. 2 illustrates an arrangement 200 of a solid state drive 102 in accordance with one embodiment of the invention. For clarity of illustration, FIG. 2 is discussed with reference to FIG. 1. In one embodiment of the invention, the controller 130 segregates or divides the memory modules 0-3 140, 142, 144, and 146 into a logical area and a physical area.

The logical area is illustrated with logical area (L-area) 1 221, L-area 2 222, L-area 3 223, and L-area 4 224. In one embodiment of the invention, the logical area is divided or granulized into smaller units or elements that matches the size of a logical band (L-band). The L-bands 210 has L-band 1

(L1) to L-band 22 (L22). In one embodiment of the invention, the size of each L-band is the size of an erase block that has one or more pages. The host usage of each L-band is tracked by the controller 130 in one embodiment of the invention. In another embodiment of the invention, a firmware or software can loaded to the controller 130 to track the host usage of each L-band.

A L-band with a relatively high rate of host writes is considered dynamic and a L-Band with a relatively low rate of host writes is considered static in one embodiment of the invention. In one embodiment of the invention, a L-band is considered dynamic when its rate of host writes is higher than the average rate of host writes of all the L-bands. In another embodiment of the invention, a L-band is considered static when its rate of host writes is lower than the average rate of host writes of all the L-bands. In one embodiment of the invention, the rate or frequency of the host writes to a particular L-band is an weighted average of the recent host writes to the particular L-band.

When a host write operation is performed on a particular L-band, it causes the particular L-band to become dynamic. When no host write operations are performed on the particular L-band, a slow periodic decay function causes the particular L-band to become static. The static L-bands 235 and the dynamic L-bands 230 shows a list of static L-bands and dynamic L-bands respectively. A particular L-band can move from the static L-bands 235 to the dynamic L-bands 230 and vice-versa.

For example, in one embodiment of the invention, L-area 1 221 is made up of five L-bands (L1-L5). When a host writes data to the L-area 1 221, the controller 130 sets the five L-bands associated with the L-area 1 221 as dynamic. The L1-L5 are moved from the list of static L-bands 235 to the list of dynamic L-bands 230. In another example, the L-area 2 222 is made up of four L-bands (L6-L9). When no data is written to the L-area 2 222, the controller 130 sets the four L-bands associated with the L-area 2 222 to be static based on a slow periodic decay function. The L6-L9 are moved from the list of dynamic L-bands 230 to the list of static L-bands 235. In one embodiment of the invention, the controller 130 checks after a periodic or fixed number of machine cycles if the logical area has been assessed. Based on the slow periodic decay function, the controller 130 determines when to set the L-bands of the logical area as static.

The method of classifying the L-bands 210 is not meant to be limiting and one of ordinary skill in the relevant will readily appreciate that other methods of classification can be used without affecting the workings of the invention.

The physical area is also divided or granularized into smaller units or elements shown as physical bands (P-bands) 240. The physical area is illustrated with twenty-two P-bands (P1 to P22). The contents in the P-band 1 (P1) to P6, P9 to P10, and P13 to P16 are clean or have been erased. P7 to P8, P11-P12 and P17 to P22 are utilized to store content. In one embodiment of the invention, the size of each P-band is an erase block that has one or more pages.

The controller 130 sets an erase counter for each P-band and each erase count of each P-band is incremented with every erasing operation of each P-band in one embodiment of the invention. The erase counter for each P-band describes the number of times that a particular P-Band has been erased and it allows the controller 130 to track or monitor the usage pattern of each P-band. The erase count in each P-band is illustrated in brackets. For example, the P1 has an erase count of 142.

In one embodiment of the invention, the controller 130 creates a clean list 250 based on the erase counters of the P-bands 240. The clean list 250 is made up of a list of the index of the P-bands that are clean or have been erased and is sorted by the erase count of the P-bands. For example, P1 is inserted at the top of the clean list 250 as it has the highest erase count among the P-bands that are clean or have been erased. P10 is inserted at the end of the clean list 250 as it has the lowest erase count among the P-bands that are clean or have been erased. The end of the clean list 250 is termed as the cold end of the clean list, and the end of the clean list 250 is termed as the hot end of the clean list.

The allocation of a particular P-band from the clean list 250 is based on the expected usage of the particular P-band in one embodiment of the invention. For example, in one embodiment of the invention, the allocation of a new P-band in which to write or store new host information always occurs from the cold end of the clean list 250. In another embodiment of the invention, when a dynamic L-band is required to be stored, the dynamic L-band is mapped to the P-band at the coldest end of the clean list 250. When a static L-band is required to be stored, the static L-band is mapped to the P-band at the hottest end of the clean list 250. In yet another embodiment of the invention, the P-band at the middle of the clean list 250 can be used based on other storage requirements. By allocating P-bands in the clean list 250 based on their expected usage, the controller 130 can perform wear leveling of the memory modules 0-3 140, 142, 144, and 146 that does not add any cost in the write amplification.

In one embodiment of the invention, the controller 130 determines the average erase count, minimum erase count and the maximum erase count from the clean list 250. The minimum and maximum erase counts are set as the lowest and highest erase counts in the clean list 250 respectively in one embodiment of the invention.

In one embodiment of the invention, the controller determines or calculates the difference between the average erase count and the minimum erase count and checks if the difference is greater than a threshold. When the threshold is exceeded, the P-band at the end of the clean list 250 is considered to be too cold. The controller 130 performs wear leveling by mapping the cold static content to the hottest P-band in the clean list 250 in one embodiment of the invention. Using the clean list 250 as an example, the controller 130 performs wear leveling by moving or relocating the static logical content to the P1 that has an erase count 142. By doing so, the controller 130 ensures that P-bands with the lowest or minimum erase count are circulated through normal usage, instead of being stuck with static content.

In another embodiment of the invention, the controller determines or calculates the difference between the maximum erase count and the average erase count and checks if the difference is greater than a threshold. When the threshold is exceeded, the P-band at the top of the clean list 250 is considered to be too hot, i.e., the erase count of the P-band with the maximum erase count should not be increased anymore. The controller 130 performs wear leveling by mapping L-bands with static content to the P-band with the maximum erase count. Using the clean list 250 as an example, the controller 130 performs wear leveling by moving or relocating one of the static L-bands associated with L-area 1 221 to the P1 with erase count 142. By doing so, the P1 with erase count 142 or maximum erase count has a smaller chance of being erased again as it is holding static content. The wear leveling techniques of the controller allows the SSD 102 to be written more without suffering any endurance-related reliability problems in one embodiment of the invention.

In one embodiment of the invention, the controller 130 does not need the clean list 250 and creates an array of the erase counts in the 120. One of ordinary skill in the relevant art will readily appreciate that other methods of tracking the erase counters can be used without affecting the workings of the invention.

Figure 3A:
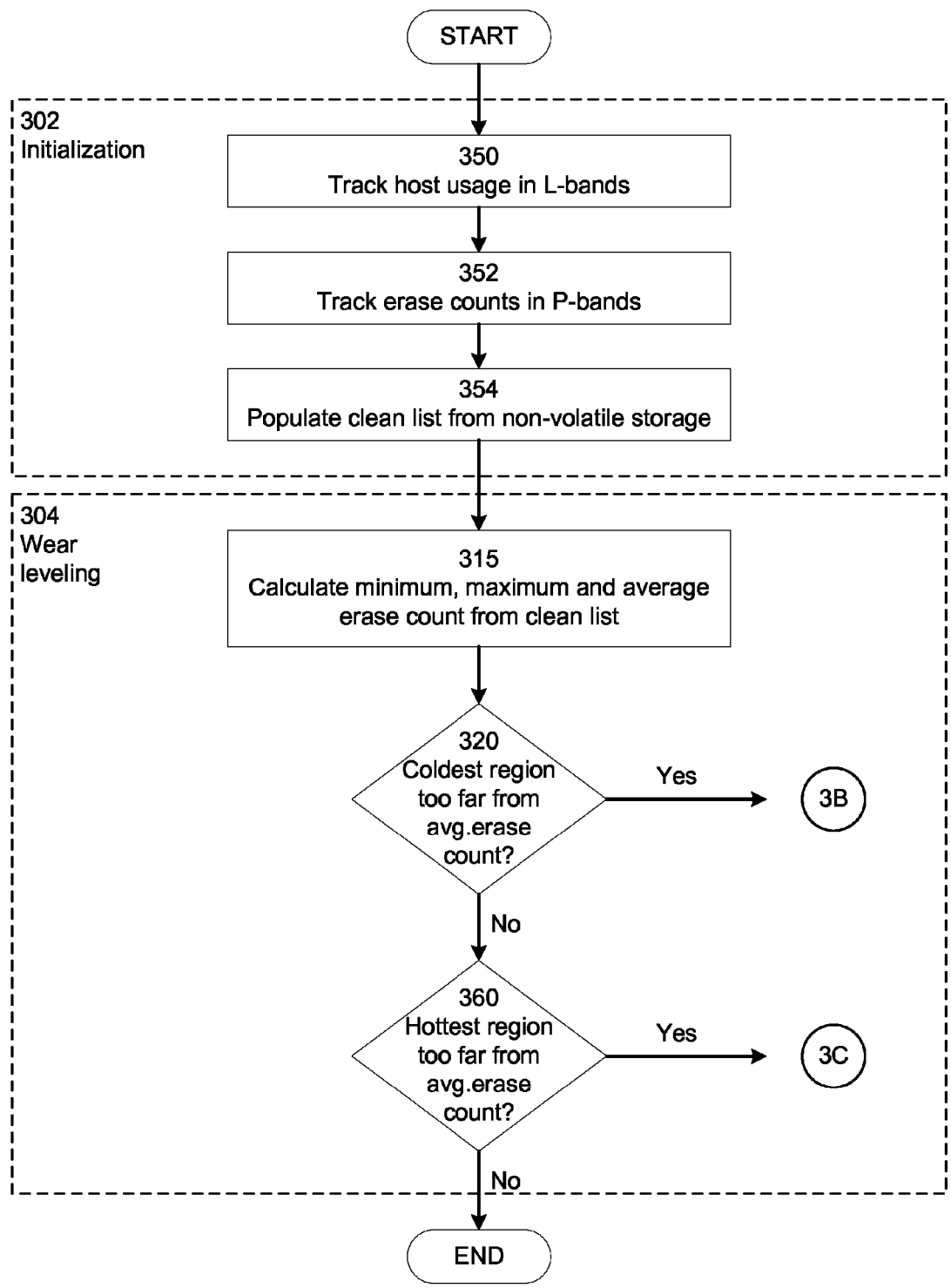
FIG. 3A illustrates a flow chart of the steps to perform wear leveling in a solid state drive in accordance with one embodiment of the invention.

FIG. 3A illustrates a flow chart 300 of the steps to perform wear leveling in a solid state drive 102 in accordance with one embodiment of the invention. For clarity of illustration, FIG. 3A is discussed with reference to FIGS. 1 and 2. The flow 300 has two main phases: the initialization phase 302 and the wear leveling phase 304. During the initialization phase 302, the controller 130 tracks the host usage of the L-bands 210 in step 350. In one embodiment of the invention, every L-band is initialized as static when the SSD 102 is powered up or enabled. In another embodiment of the invention, the static/dynamic state of every L-band is stored in a non-volatile storage and is restored from the non-volatile storage when the SSD 102 is powered up or enabled. When a particular L-band is written or accessed by a host machine, the controller 130 sets the particular L-band as dynamic. The particular L-band is reverted back to static based on a slow decay function when no further write operations are performed on the particular L-band.

In step 352, the controller 130 tracks the erase count of each P-band. In one embodiment of the invention, the erase count of each P-band is stored in a non-volatile manner. This allows the controller 130 to keep a current record of the erase count of each P-band even when the SSD 102 is powered off or disabled. In step 354, the controller 130 populates a clean list 250 from non-volatile storage that tracks the erase counts of the P-bands 240 by indexing the P-band number. The order of the clean list 250 is based on the erase counts of the P-bands 240.

The wear leveling phase 304 begins with step 315 where the controller 130 determines the minimum erase count, maximum erase count and average erase count from the clean list 250. In step 320, the controller 130 checks if the coldest region or end in the clean list 250 is too far from the average erase count. In one embodiment of the invention, the controller 130 performs step 320 by checking if the difference between average erase count and the minimum erase count is greater than a threshold. If yes, the flow 300 goes to step 3B. If no, the flow checks if the hottest region or end in the clean list 250 is too far from the average erase count. In one embodiment of the invention, the controller 130 performs step 320 by checking if the difference between maximum erase count and the average erase count is greater than a threshold. If yes, the flow 300 goes to step 3C. If no, the flow 300 ends.

Figure 3B:
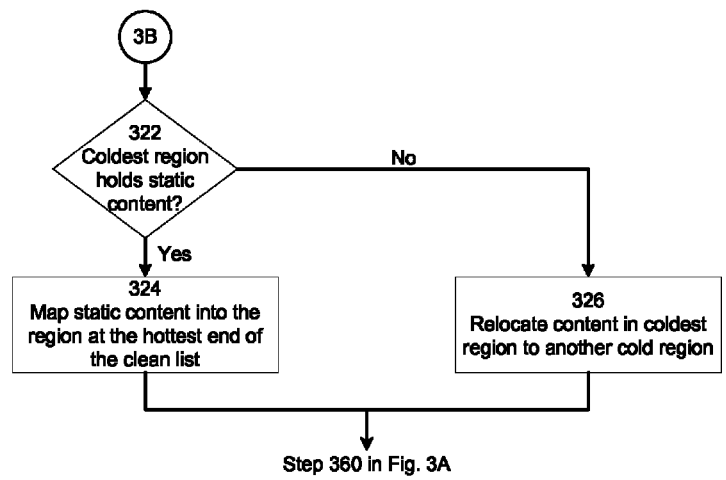
FIG. 3B illustrates a flow chart of the steps to perform wear leveling in a solid state drive in accordance with one embodiment of the invention.

FIG. 3B illustrates a flow chart 330 of the steps to perform wear leveling in a solid state drive 102 in accordance with one embodiment of the invention. For clarity of illustration, FIG. 3B is discussed with reference to FIGS. 1, 2 and 3A. In step 322, the controller 130 checks if the coldest region or part in the clean list 250 is holding static content. In one embodiment of the invention, the controller 130 performs step 322 by checking if the logical area associated with the P-band with the minimum erase count in the clean list 250 is holding static content, i.e., the L-band of the logical area is static. If yes, the controller 130 map the static content into the P-band with the highest erase count in the clean list 250 in step 326 and the flow 330 goes to step 360. If no, the controller 130 selects another P-band with a low erase count and relocates the content of the logical area associated with the P-band with the minimum erase count to the selected P-band and the flow goes to step 360. This allows the coldest region of the clean list 250 to be released so that it receives more erase cycles.

Figure 3C:
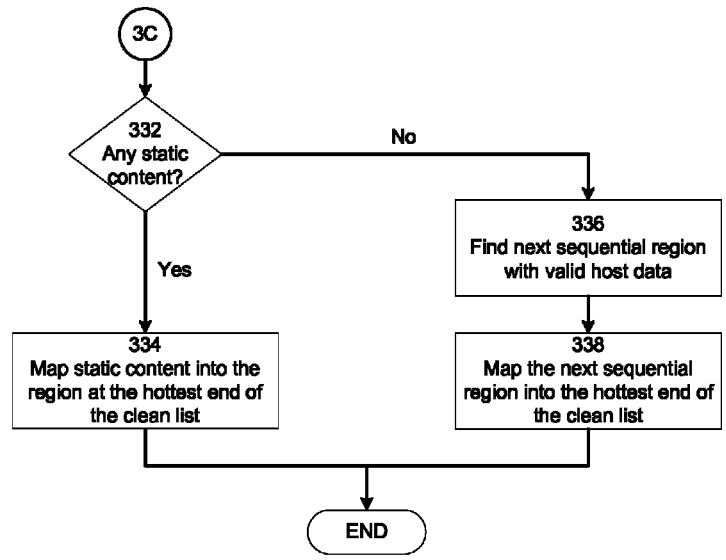
FIG. 3C illustrates a flow chart of the steps to perform wear leveling in a solid state drive in accordance with one embodiment of the invention.

FIG. 3C illustrates a flow chart 340 of the steps to perform wear leveling in a solid state drive in accordance with one embodiment of the invention. For clarity of illustration, FIG. 3C is discussed with reference to FIGS. 1, 2 and 3A. In step 332, the controller 130 checks if there are any static content, i.e., whether there are any static L-bands. If yes, the controller 130 maps the static content into the P-band with the highest erase count in the clean list 250 in step 334 and the flow 330 ends. If no, the controller 130 looks for the next sequential logical region with valid data in step 336. In step 338, the controller 130 maps the valid data of the next sequential logical region into the P-band with the highest erase count in the clean list 250 and the flow 330 ends. This allows the controller 130 to manage host workloads where the number of static regions is insufficient and it maps the logical regions to the physical regions using a circular model that causes all physical bands to rotate thru the clean list 250 and be sorted accordingly.

Figure 4:
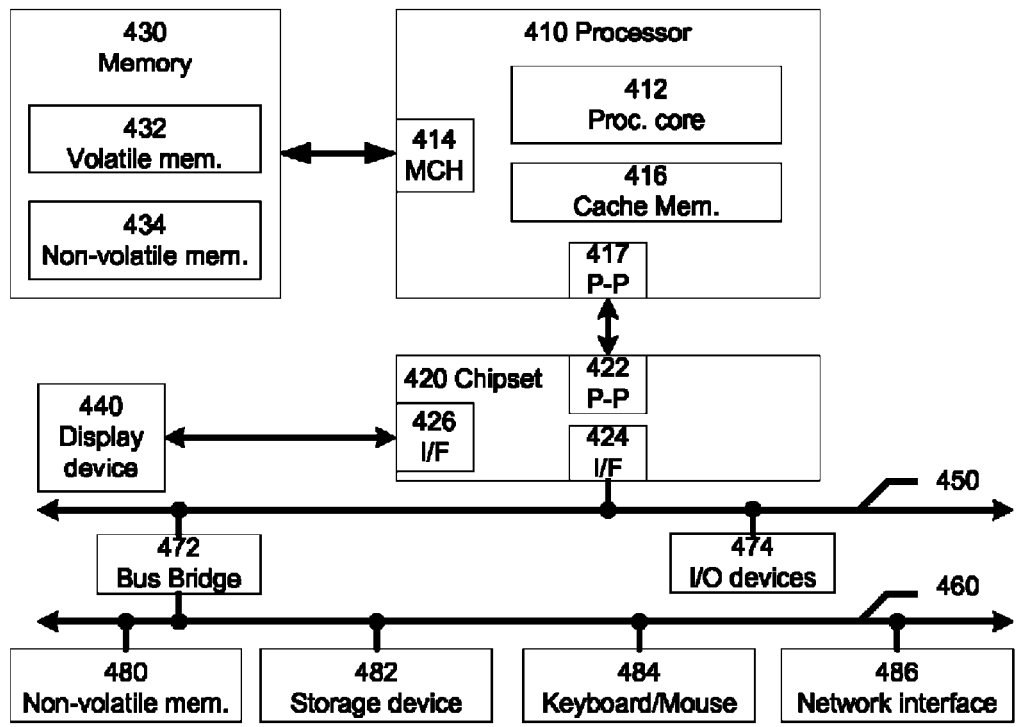
FIG. 4 illustrates a system to implement the methods disclosed herein in accordance with one embodiment of the invention.

FIG. 4 illustrates a system 400 to implement the methods disclosed herein in accordance with one embodiment of the invention. The system 400 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 400 used to implement the methods disclosed herein may be a system on a chip (SOC) system.

The processor 410 has a processing core 412 to execute instructions of the system 400. The processing core 412 includes, but is not limited to, pre-fetch logic to fetch instructions, decode logic to decode the instructions, execution logic to execute instructions and the like. The processor 410 has a cache memory 416 to cache instructions and/or data of the system 400. In another embodiment of the invention, the cache memory 416 includes, but is not limited to, level one, level two and level three, cache memory or any other configuration of the cache memory within the processor 410.

The memory control hub (MCH) 414 performs functions that enable the processor 410 to access and communicate with a memory 430 that includes a volatile memory 432 and/or a non-volatile memory 434. The volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 434 includes, but is not limited to, NAND flash memory, phase change memory (PCM), read only memory (ROM), electrically erasable programmable read only memory (EEPROM), or any other type of non-volatile memory device.

The memory 430 stores information and instructions to be executed by the processor 410. The memory 430 may also stores temporary variables or other intermediate information while the processor 410 is executing instructions. The chipset 420 connects with the processor 410 via Point-to-Point (PtP) interfaces 417 and 422. The chipset 420 enables the processor 410 to connect to other modules in the system 400. In one embodiment of the invention, the interfaces 417 and 422 operate in accordance with a PtP communication protocol such as the Intel® QuickPath Interconnect (QPI) or the like.

The chipset 420 connects to a display device 440 that includes, but is not limited to, liquid crystal display (LCD), cathode ray tube (CRT) display, or any other form of visual display device. In one embodiment of the invention, the processor 410 and the chipset 420 are merged into a SOC. In addition, the chipset 420 connects to one or more buses 450 and 455 that interconnect the various modules 474, 460, 462, 464, and 466. Buses 450 and 455 may be interconnected together via a bus bridge 472 if there is a mismatch in bus speed or communication protocol. The chipset 420 couples with, but is not limited to, a non-volatile memory 460, a storage device(s) 462, a keyboard/mouse 464 and a network interface 466. In one embodiment of the invention, the solid state drive 102 is the storage device 462.

The storage device 462 includes, but is not limited to, a solid state drive, a hard disk drive, an universal serial bus flash memory drive, or any other form of computer data storage medium. The network interface 466 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although the cache memory 416 is depicted as a separate block within the processor 410, the cache memory 416 can be incorporated into the processor core 412 respectively. The system 400 may include more than one processor/processing core in another embodiment of the invention.

The methods disclosed herein can be implemented in hardware, software, firmware, or any other combination thereof. Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. A method comprising:
   determining erase counts of physical regions of a storage device, wherein the erase count indicates a number of times the physical region associated with the erase count has been subject to an erase operation;
   determining whether a logical region stored in the physical region having the lowest erase count has static content, wherein logical regions having static content have a lower rate of host writes than logical regions having dynamic content;
   mapping the logical region determined to have the static content in the physical region having the lowest erase count into a respective one of the physical regions of the storage device having a higher erase count than the physical region having the lowest erase count.

2. The method of claim 1, wherein the static content comprises content having a rate of write access lower than an average rate of write access of logical regions.

3. The method of claim 1, further comprising:
   determining a rate of write access of each logical region; and
   determining an erase count of each physical region, wherein the erase count of each physical region is to be incremented responsive to every erasing operation of each physical region.

4. The method of claim 3, wherein the one or more physical regions comprise one or more physical regions that are clean or have been erased, the method further comprising:
   sorting the erase count of each physical region that is clean or has been erased in an increasing order to form a list; and
   determining a minimum erase count, a maximum erase count, and the average erase count from the list.

5. The method of claim 4, further comprising:
   determining whether a difference between the average erase count and the minimum erase count is to exceed a threshold; and wherein mapping the one logical region into the respective one physical region comprises mapping the one logical region into a respective one physical region that is clean or has been erased responsive to the determination that the difference is to exceed the threshold.

6. The method of claim 4, further comprising:
   determining whether a difference between the maximum erase count and the average erase count is to exceed a threshold; and wherein mapping the one logical region into the respective one physical region comprises mapping the one logical region into a respective one physical region that is clean or has been erased responsive to the determination that the difference is to exceed the threshold.

7. The method of claim 4, further comprising:
   allocating every new write access operation to a physical region with the minimum erase count in the list.

8. The method of claim 4, further comprising:
allocating one of one or more physical regions that are clean or have been erased for a new write access operation based on an expected usage of contents to be written by the new write access operation.

9. The method of claim 4, wherein the one logical region is to be associated with a physical region with the minimum erase count and wherein the erase count of the respective one physical region is the maximum erase count.

10. The method of claim 1, wherein the storage device comprises a solid state drive having one or more NAND flash memories.

11. An apparatus comprising:
one or more NAND flash memories, wherein the one or more NAND flash memories are to be partitioned into one or more logical bands and one or more physical bands; and
logic coupled with the one or more NAND flash memories to perform:
determining erase counts of physical bands, wherein the erase count indicates a number of times the physical band associated with the erase count has been subject to an erase operation;
determining at least one logical band stored in the physical band having a lowest erase count of physical bands and having static content, wherein logical bands having static content have a lower rate of host writes than logical bands having dynamic content;
relocating static content in the at least one logical band determined to have the static content in the at least one physical band having the lowest erase count of the physical bands into at least one physical band having an erase count exceeding the average erase count of the physical bands.

12. The apparatus of claim 11, wherein the logic is further to:
determine a frequency of write operation of each logical band; and
determine an erase count of each physical band, wherein the erase count of each physical band is to be incremented responsive to every erasing operation of each physical band.

13. The apparatus of claim 12, wherein the one or more physical bands comprise one or more physical bands that are clean or have been erased, and wherein the logic is further to:
create an array based on the erase count of each physical band that is clean or has been erased, wherein the array is to be sorted by an increasing order of the erase count of each physical band that is clean or has been erased; and
calculate a minimum erase count, a maximum erase count, and an average erase count from the array.

14. The apparatus of claim 13, wherein the at least one physical band is the physical band having the maximum erase count in the array.

15. The apparatus of claim 13, wherein the logic is further to:
determine whether a difference between the average erase count and the minimum erase count is greater than a threshold; and wherein the logic to relocate the static content in the at least one logical band to the at least one physical band is to relocate the static content in the at least one logical band to the at least one physical band responsive to the determination that the difference is greater than the threshold.

16. The apparatus of claim 13, wherein the logic is further to:
determine whether a difference between the maximum erase count and the average erase count is greater than a threshold; and wherein the logic to relocate the static content in the at least one logical band to the at least one physical band is to relocate the static content in the at least one logical band to the at least one physical band responsive to the determination that the difference is greater than the threshold.

17. A system comprising:
a solid state drive, the solid state drive comprising:
a NAND flash memory; and
a controller to:
determine erase counts of physical regions of a storage device, wherein the erase count indicates a number of times the physical region associated with the erase count has been subject to an erase operation;
determine whether information in one of a plurality of logical areas of the NAND flash memory is static, wherein logical regions having static content have a lower rate of host writes than logical regions having dynamic content, wherein the one logical area is associated with a first physical area of a plurality of physical areas having a lowest erase count of the physical areas; and
relocate the information in the one logical area in the first physical area having the lowest erase count to a second physical area of the plurality of physical areas responsive to the determination that the information in the one logical area is not static, wherein the second physical area has an erase count lower than the average erase count and higher than the lowest erase count.

18. The system of claim 17, wherein the controller is further to:
map the information in the one logical area to a third of the plurality of physical areas responsive to the determination that the information in the one logical area is static, wherein the third physical area is to have a third erase count higher than the average erase count.

19. The system of claim 17, wherein the controller is further to:
determine that none of the logical areas is to hold static information;
determine another logical area having valid information, wherein an address of the other logical area is sequential to an address of the one logical area; and
map the valid information of the other logical area to a third of the plurality of physical areas, wherein the third physical area is to have a third erase count higher than the average erase count.

20. The system of claim 19, wherein the controller is further to:
determine a rate of write access of each logical area; and
determine an erase count of each physical area, wherein the erase count of each physical area is incremented responsive to every erasing operation of each physical area.

21. The system of claim 20, wherein the controller is further to:
form a list using the erase count of each physical area that is clean or has been erased, wherein the list is arranged in an increasing order of the erase count of each physical area; and
determine a minimum erase count, a maximum erase count, and an average erase count from the list.

22. The system of claim 21, wherein the controller is further to:
- determine whether a difference between the average erase count and the minimum erase count is greater than a threshold; and wherein the controller, which is to relocate the information in the one logical area to the second physical area responsive to the determination that the information in the one logical area is not static, is to relocate the information in the one logical area to the second physical area responsive to the determination that the information in the one logical area is not static and responsive to the determination that the difference is greater than the threshold.

23. The system of claim 21, wherein the controller is further to:
- determine whether a difference between the maximum erase count and the average erase count is greater than a threshold; and wherein the controller, which is to map the information in the one logical area to the third physical area responsive to the determination that the information in the one logical area is static, is to map the information in the one logical area to the third physical area responsive to the determination that the information in the one logical area is static and responsive to the determination that the difference is greater than the threshold.

* * * * *